US009748025B2

(12) United States Patent
Zhou et al.

(10) Patent No.: US 9,748,025 B2
(45) Date of Patent: Aug. 29, 2017

(54) MAGNETORESISTIVE CURRENT LIMITER

(71) Applicant: MultiDimension Technology Co., Ltd., Zhangjiagang (CN)

(72) Inventors: Zhimin Zhou, Zhangjiagang (CN); James Geza Deak, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 29 days.

(21) Appl. No.: 14/908,366

(22) PCT Filed: Jul. 25, 2014

(86) PCT No.: PCT/CN2014/083054
§ 371 (c)(1),
(2) Date: Jan. 28, 2016

(87) PCT Pub. No.: WO2015/014248
PCT Pub. Date: Feb. 5, 2015

(65) Prior Publication Data
US 2016/0163431 A1    Jun. 9, 2016

(30) Foreign Application Priority Data

Jul. 30, 2013 (CN) .......................... 2013 1 0325339

(51) Int. Cl.
*H01L 43/00* (2006.01)
*H01C 7/13* (2006.01)
(Continued)

(52) U.S. Cl.
CPC ............ *H01C 7/13* (2013.01); *G01R 33/091* (2013.01); *G01R 33/098* (2013.01); *H01L 43/08* (2013.01); *H02H 9/02* (2013.01)

(58) Field of Classification Search
CPC . H01C 7/13; H01L 43/08; H02H 9/02; G01R 33/091
(Continued)

(56) References Cited

U.S. PATENT DOCUMENTS 6,275,365 B1 *   8/2001   Kalsi .................. H01F 6/06
                                                           174/125.1
6,847,513 B2 *   1/2005   Clapp, III ............. G11B 5/012
                                                           361/58
(Continued)

FOREIGN PATENT DOCUMENTS

CN          1251939          5/2000
CN          1619913          5/2005
(Continued)

OTHER PUBLICATIONS

"International Application No. PCT/CN2014/083054, International Search Report and Written Opinion mailed Nov. 6, 2014", (Nov. 6, 2014), 12 pgs.

*Primary Examiner* — Kyung Lee
(74) *Attorney, Agent, or Firm* — Schwegman Lundberg & Woessner, P.A.

(57) ABSTRACT

A magnetoresistive current limiter, comprising a substrate, a magnetoresistive sensor layer, a first insulating layer, a coil, a second insulating layer, a magnetic shield layer, and an input electrode and output electrode. The coil is located between the magnetic shield layer and the magnetoresistive sensor layer. The first and second insulating layers are isolated from the magnetoresistive sensor layer and the coil, and from the coil and the magnetic shield layer, respectively; the magnetoresistive sensor layer and the coil are connected in series, and are connected to the input electrode and the output electrode. The magnetoresistive sensor layer comprises N rows of array-type magnetic tunnel junction lines; the coil comprises 2*N+M (N>1, M=−1 or 3) conductive lines in series or N+M (N>1, M=0 or 2) conductive lines in parallel; current flows in the same direction into the conductive lines located above or below the tunnel junction lines and produces, at the magnetic tunnel junction lines, a uniform magnetic field. The magnetic tunnel junction of the
(Continued)

magnetically sensitive axis is perpendicular to the magnetic tunnel junction lines, and the magnetoresistive sensor layer has the feature of a monotonic or axisymmetric linear rise in resistance to the magnetic field. The magnetoresistive current limiter has the features of rapid response, continuous operation, and ability to increase or decrease current.

12 Claims, 11 Drawing Sheets

(51) Int. Cl.
*H01L 43/08* (2006.01)
*G01R 33/09* (2006.01)
*H02H 9/02* (2006.01)

(58) Field of Classification Search
USPC ........................................................ 338/32 R
See application file for complete search history.

(56) References Cited

U.S. PATENT DOCUMENTS

| | | | |
|---|---|---|---|
| 7,345,858 B2* | 3/2008 | Lee | ........................ H01L 39/20 361/19 |
| 7,633,108 B2* | 12/2009 | Li | ..................... H01L 29/66143 257/288 |
| 7,679,867 B2* | 3/2010 | Choi | ........................ H01F 6/00 335/216 |
| 2006/0268471 A1 | 11/2006 | Lee et al. | |

FOREIGN PATENT DOCUMENTS

| | | |
|---|---|---|
| CN | 102043089 | 5/2011 |
| CN | 103414176 | 11/2013 |
| CN | 203481806 | 3/2014 |
| EP | 0620570 | 10/1994 |
| JP | 2013038334 | 2/2013 |
| WO | WO-2015014248 | 2/2015 |

* cited by examiner

MAGNETORESISTIVE CURRENT LIMITER

PRIORITY CLAIM TO RELATED APPLICATIONS

This application is a U.S. national stage application filed under 35 U.S.C. §371 from International Application Serial No. PCT/CN2014/083054, which was filed 25 Jul. 2014, and published as WO2015/014248 on 5 Feb. 2015, and which claims priority to Chinese Application No. 201310325339.4, filed 30 Jul. 2013, which applications and publication are incorporated by reference as if reproduced herein and made a part hereof in their entirety, and the benefit of priority of each of which is claimed herein.

TECHNICAL FIELD

The present invention relates to the field of magnetic sensor technologies, and in particular, to a new magnetoresistive current limiter.

BACKGROUND ART

In an electronic circuit, due to the presence of fluctuation in the industrial power network, for example, when other electrical appliances are connected to or disconnected from the power grid, and due to incorrect wiring or device failure, when a power circuit is turned on, instantaneous charging of a capacitive element and other factors may lead to high current surge, to cause electronic devices such as LEDs to be damaged. In contrast, the other situation is that grid voltage fluctuations result in that under-voltage occurs instantaneously in the circuit, causing the working current to be lower than the normal working current value.

In order to solve the problem, it is necessary to use an electric heating element as a current limiter to protect electronic elements, through the parameter performance of the electric heating element, for example, the change of the resistance, it is possible to increase the resistance and decrease the current in the case of high current, it is possible to decrease the resistance to increase the current in the case of insufficient current, and in the case of stable current, the resistance can be restored to the normal resistance value to achieve a current limiting effect, to protect elements in the circuit. Generally, the electric heating element used is divided into two types, one type is an electric heating element with a positive temperature coefficient of resistance, when the current is increased, the electric heating element emits heat, and the temperature rises to cause the resistance to increase rapidly, thereby decreasing amplitude of the current. Moreover, for the circuit where the capacitive element is present, for example, an AC-DC power circuit, at startup, the capacitor is charged to lead to an instantaneous peak current, and the other type of electric heating element with a negative temperature coefficient of resistance is used, that is, in an initial stage, the electric heating element has higher resistance, for limiting instantaneous surge current of capacitor charging in the beginning, and when the capacitor works normally, the resistor starts emitting heat and the temperature rises, resulting in that the resistance is decreased and consumption is reduced.

However, the electric heating element, when used for limiting the current, has the following disadvantages and shortcomings:

1) The change of the resistance value of the electric heating element depends on a temperature change caused by heat conduction, rise and fall of the temperature generally require a certain time, therefore, the response speed is relatively slow and the change of the temperature depends on an environment where the electric heating element is, for example, a change of an environment temperature, and other elements possibly existing in the vicinity of the electric heating element, for example, a PCB board and the like, may affect the corresponding quantity and the corresponding speed thereof;

2) if the current in the circuit continuously generates peak values at an interval of a very short time, the electric heating element can change correspondingly in the beginning, and for the subsequent change, since the temperature cannot be restored to a stable working state within a short time, the electric heating element cannot play a role of limiting the current; and 3) the electric heating element can only limit the surge current in the circuit but cannot play a role in a situation where the current is lower than the normal value, to cause the amplitude of decrease of the current to be limited.

SUMMARY OF THE INVENTION

In order to solve the foregoing problems, the present invention provides a new magnetoresistive current limiter, wherein, by using the characteristic that resistances of magnetic tunnel junctions change with external magnetic fields, current is converted to a magnetic field through a coil, when the current increases, the magnetic field increases, resulting in increase of the resistances of the magnetic tunnel junctions, to cause the amplitude of increase of the current to be limited, and when the circuit returns to normal, the magnetic field and the resistance can quickly go back to the normal value; or in the other situation, when the current decreases, the magnetic field decreases, and the resistances of the magnetic tunnel junctions decrease, to cause the amplitude of decrease of the current to be limited, and when the circuit returns to normal, the magnetic field and the resistance go back to the normal value.

The magnetoresistive current limiter according to the present invention includes: a substrate, an input electrode, an output electrode, a magnetoresistive sensor layer, a first insulating layer, a coil, a second insulating layer and a magnetic shield layer; wherein the coil is located between the magnetic shield layer and the magnetoresistive sensor layer, the first insulating layer isolates the coil from the magnetoresistive sensor layer, and the second insulating layer isolates the coil from the magnetic shield layer; and the magnetoresistive sensor layer includes N rows of array-type magnetic tunnel junction lines, N is an integer greater than 1, each row of magnetic tunnel junction lines include one or more interconnected magnetic tunnel junction units, the magnetic tunnel junction lines form a two-port structure of the magnetoresistive sensor layer in a mode of series connection, parallel connection or a combination of series connection and parallel connection, the coil also has a two-port structure, one port of the magnetoresistive sensor layer is connected with one port of the coil, the other port of the magnetoresistive sensor layer is connected with the input electrode, and the other port of the coil is connected with the output electrode; and current flows into the magnetoresistive sensor layer via the input electrode and then flows out of the output electrode via the coil.

Preferably, the resistance of the magnetoresistive sensor layer is in a linear relationship with a magnetic field produced by the current flowing through the input electrode-output electrode, or the resistance of the magnetoresistive sensor layer forms symmetric linear distribution characteristics with an absolute value of the magnetic field produced by the current flowing through the input electrode-output electrode, when the current flowing through the input electrode-output electrode is a normal value, the resistance of the magnetoresistive sensor layer is in the position of a minimum value or maximum value, and with increase or decrease of direct current, the corresponding resistance thereof also increases or decreases correspondingly.

Preferably, the magnetic tunnel junction units are connected in a mode of series connection, parallel connection or a combination of series connection and parallel connection, and magnetically sensitive axes of the magnetic tunnel junction units are perpendicular to the magnetic tunnel junction lines.

Preferably, the coil includes (2*N+M) conductive lines, wherein N>1, M=−1 or 3, the conductive lines are connected in series, the conductive lines are parallel to the magnetic tunnel junction lines, part of the conductive lines are located above or below the magnetic tunnel junction lines, the other part of the conductive lines are located between the magnetic tunnel junction lines, the current flows, in the positive direction, into the conductive lines located above or below the magnetic tunnel junction lines, and flows, in the negative direction, into the conductive lines located between the magnetic tunnel junction lines.

Preferably, the coil includes (N+M) conductive lines, wherein N>1, M=0 or 2, the conductive lines are connected in parallel, the conductive lines are parallel to the magnetic tunnel junction lines, the conductive lines are located above or below the magnetic tunnel junction lines, and current flows in the same direction into the conductive lines respectively.

Preferably, when M>0, sectional dimensions of the conductive lines of the coil are the same; when M=0 or M<0, the sectional dimensions of the conductive lines of the coil are changed so as to ensure that a constant magnetic field in the direction of a sensitive axis is produced at the position of each magnetic tunnel junction line of the magnetoresistive sensor layer.

Preferably, the first insulating layer and the second insulating layer are made of silicon dioxide, aluminum oxide, silicon nitride, photoresist or benzocyclobutene.

Preferably, the coil is made of such a high conductivity metal material as copper, gold or silver.

Preferably, the magnetic shield layer is made of such a high permeability ferromagnetic alloy as NiFe, CoFeSiB, CoZrNb, CoFeB, FeSiB or FeSiBNbCu.

Preferably, the coil has a thickness of 1 µm to 10 µm, the conductive lines have a width of 5 µm to 40 µm, and the spacing between two adjacent conductive lines is 10 µm to 100 µm.

Preferably, both the first insulating layer and the second insulating layer have a thickness of 100 µm to 1000 µm.

Preferably, the magnetic shield layer has a thickness of 1 µm to 10 µm.

Compared with the prior art, the present invention has the following beneficial effects:

(1) the new magnetoresistive current limiter according to the present invention is manufactured completely by using a semiconductor process, which can achieve mass production, reduce the production cost and improve consistency of products;

(2) the resistance of the magnetoresistive sensor layer and the magnetic field have rapid response, also have higher sensitivity, and have the feature of low power consumption, do not emit heat, and thus are less affected by environments and have strong repeatability; and (3) the operation of the magnetoresistive current limiter is not limited by the time of the event of adjacent current surges, and can provide instant response.

The magnetoresistive current limiter, in addition to being capable of achieving the general limitation to the surge current, can also play a role of limiting the current lower than the normal value.

BRIEF DESCRIPTION OF THE DRAWINGS

In order to illustrate the technical solutions in embodiments of the present utility model or the prior art more clearly, the accompanying drawings to be used for describing the embodiments are introduced briefly in the following. Apparently, the accompanying drawings in the following description are only some embodiments of the present utility model; persons of ordinary skill in the art can obtain other drawings according to the accompanying drawings without paying any creative efforts.

DETAILED DESCRIPTION OF THE PREFERRED EMBODIMENTS

The present invention is described below in detail with reference to the accompanying drawings and in combination with embodiments.

Embodiment 1

Figure 1:
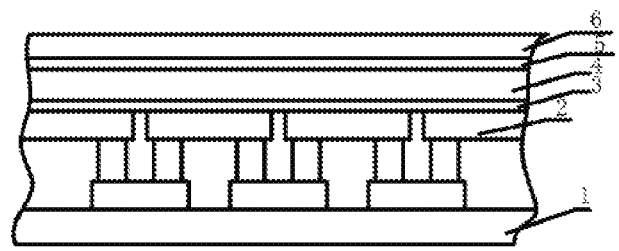
FIG. 1 is a side view of one topology structure of a magnetoresistive current limiter (the sensor is located below the coil)
Figure 2:
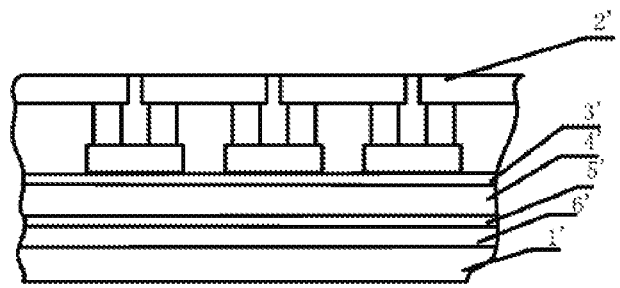
FIG. 2 is a side view of another topology structure of the magnetoresistive current limiter (the sensor is located above the coil)

The present invention provides a magnetoresistive current limiter, and FIG. 1 and FIG. 2 are side views of two topology structures corresponding to the magnetoresistive current limiter respectively. The magnetoresistive current limiter includes a substrate 1 (1'), a magnetoresistive sensor layer 2 (2'), a first insulating layer 3 (3'), a coil 4 (4'), a second insulating layer 5 (5') and a magnetic shield layer 6 (6'). The coil 4 (4') is located between the magnetic shield layer 6 (6') and the magnetoresistive sensor layer 2 (2'), the first insulating layer 3 (3') isolates the coil 4 (4') from the magnetoresistive sensor layer 2 (2'), and the second insulating layer 5 (5') isolates the coil 4 (4') from the magnetic shield layer 6 (6'). In the topology structure shown in FIG. 1, the magnetic shield layer 6 is located on the coil 4 and the magnetoresistive sensor layer 2 is directly located on the substrate 1, and in the topology structure shown in FIG. 2, the coil 4' is located on the magnetic shield layer 6', and the magnetic shield layer 6' is directly located on the substrate 1.

The magnetoresistive sensor layer 2 (2') includes N rows of array-type magnetic tunnel junction lines, N is an integer greater than 1, each row of the magnetic tunnel junction lines include one or more interconnected magnetic tunnel junction units, the magnetic tunnel junction units may be connected in a mode of series connection, parallel connection or a combination of series connection and parallel connection, and magnetically sensitive axes of the magnetic tunnel junction units are perpendicular to the magnetic tunnel junction lines. The magnetic tunnel junction lines form a two-port structure of the magnetoresistive sensor layer in a mode of series connection, parallel connection or a combination of series connection and parallel connection, and the coil 4 (4') also has a two-port structure. FIGS. 3-14 are top views of the magnetoresistive current limiter, from which it can be seen that one port of the magnetoresistive sensor layer 2 (2') is connected with one port of the coil 4 (4'), the other port of the magnetoresistive sensor layer is connected with the input electrode 8, and the other port of the coil is connected with the output electrode 7, so that the magnetoresistive sensor layer and the coil form a series structure therebetween, and the current flows into the magnetoresistive sensor layer 2 (2') via the input electrode 8 and then flows out of the output electrode 7 via the coil 4 (4'). The coil 4 (4') includes multiple conductive lines, the number of the lines is relevant to the number N of the magnetic tunnel junction lines, the conductive lines and the magnetic tunnel junction lines are parallel to each other, and the magnetic tunnel junction lines are located in positions above or below the conductive lines.

Figure 3:
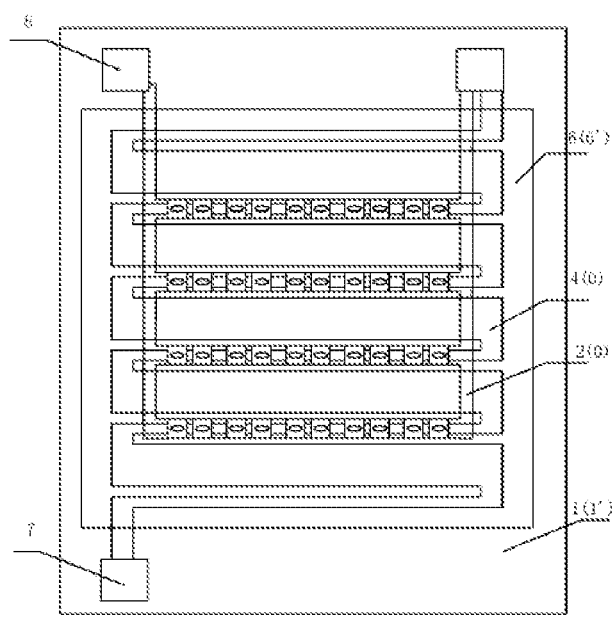
FIG. 3 is a top view of a typical magnetoresistive current limiter including N rows of magnetic tunnel junction lines connected in parallel and 2*N+M (M=3) rows of conductive lines connected in series.
Figure 4:
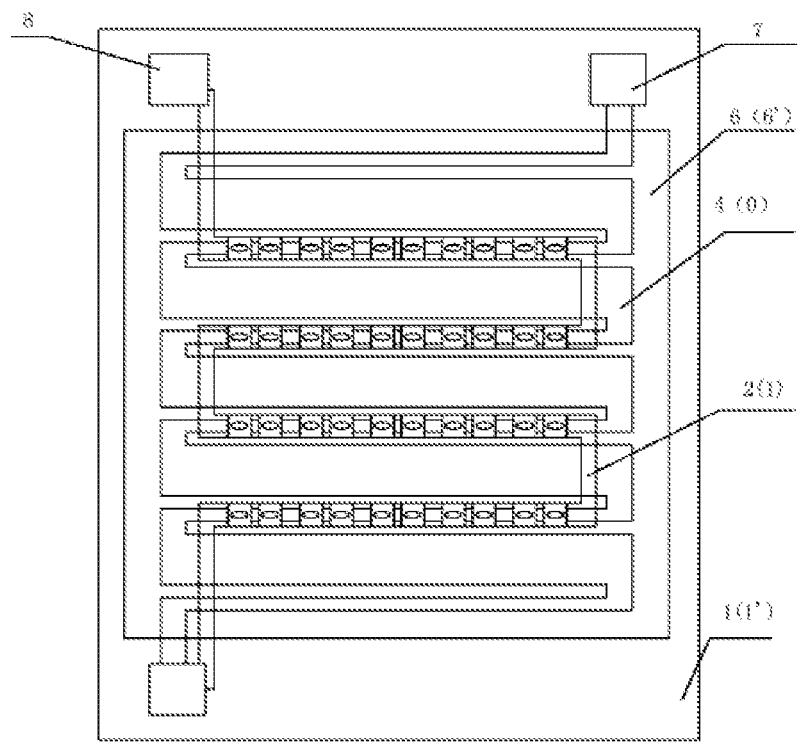
FIG. 4 is a top view of a typical magnetoresistive current limiter including N rows of magnetic tunnel junction lines connected in series and 2*N+M (M=3) rows of conductive lines connected in series.
Figure 5:
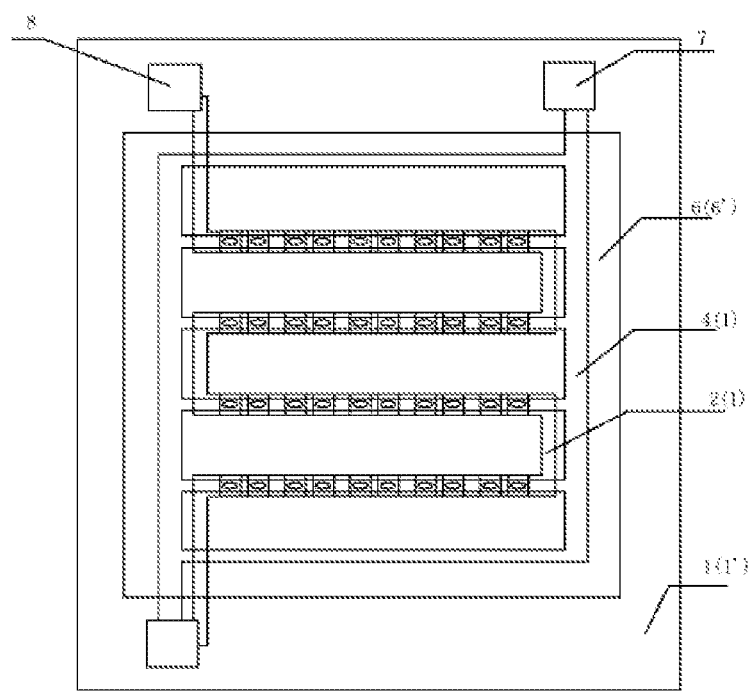
FIG. 5 is a top view of a typical magnetoresistive current limiter including N rows of magnetic tunnel junction lines connected in series and N+M (M=2) rows of conductive lines connected in parallel.
Figure 6:
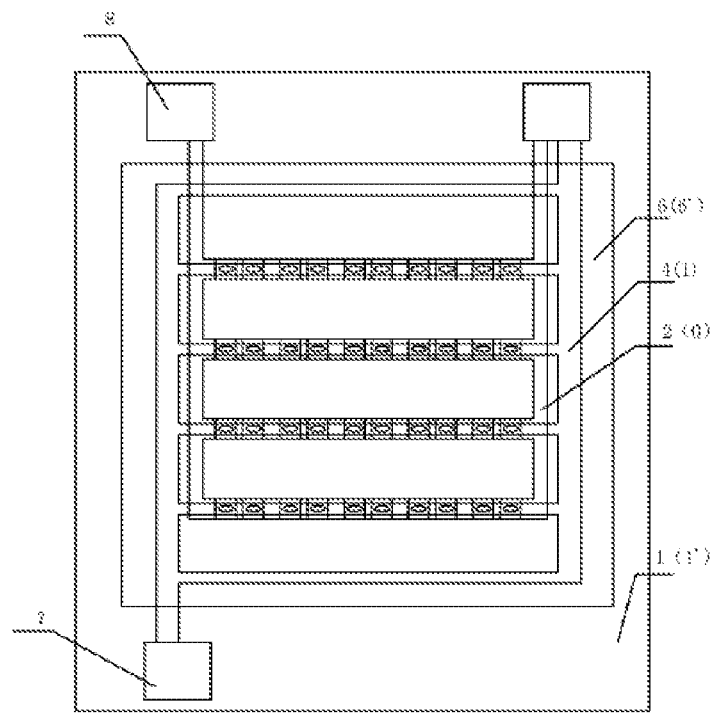
FIG. 6 is a top view of a typical magnetoresistive current limiter including N rows of magnetic tunnel junction lines connected in parallel and N+M (M=2) rows of conductive lines connected in parallel.

The magnetoresistive sensor layer 2 (2') and the coil 4 (4') have several different forms as follows:

In the magnetoresistive current limiter shown in FIGS. 3-6, the magnetoresistive sensor layer includes N array-type magnetic tunnel junction lines, the magnetic tunnel junction units in each row are connected in series, and the magnetic tunnel junction lines are connected in series to form a two-port structure of the magnetoresistive sensor layer 2 (1) as shown in FIG. 4 and FIG. 5 or connected in parallel to form a two-port structure of the magnetoresistive sensor layer 2 (0) as shown in FIG. 3 and FIG. 6. For the two structures of the magnetoresistive sensor layer, the corresponding coil has two structures: one is that the coil includes 2*N+M (M=3) conductive lines, and the conductive lines form the series connection shown by the part of the coil 4 (0) as in FIG. 3 and FIG. 4. Part of the conductive lines are located above or below the magnetic tunnel junction lines, other parts of the conductive lines are located between the magnetic tunnel junction lines, if current flows, in the positive direction, into the conductive lines above or below the magnetic tunnel junction lines, the conductive lines having positive-direction currents have the same sectional dimension, and if the current flows, in the negative direction, into the conductive lines between the magnetic tunnel junction lines, the conductive lines having negative-direction currents have the same sectional dimension; the other one is that the coil includes N+M (M=2) conductive lines, and the conductive lines form the parallel connection shown by the part of the coil 4 (1) as in FIG. 5 and FIG. 6; the conductive lines are all located above or below the magnetic tunnel junction lines, the current flows in the same direction into the conductive lines located above or below the magnetic tunnel junction lines, and the conductive lines have the same sectional dimension.

Figure 7:
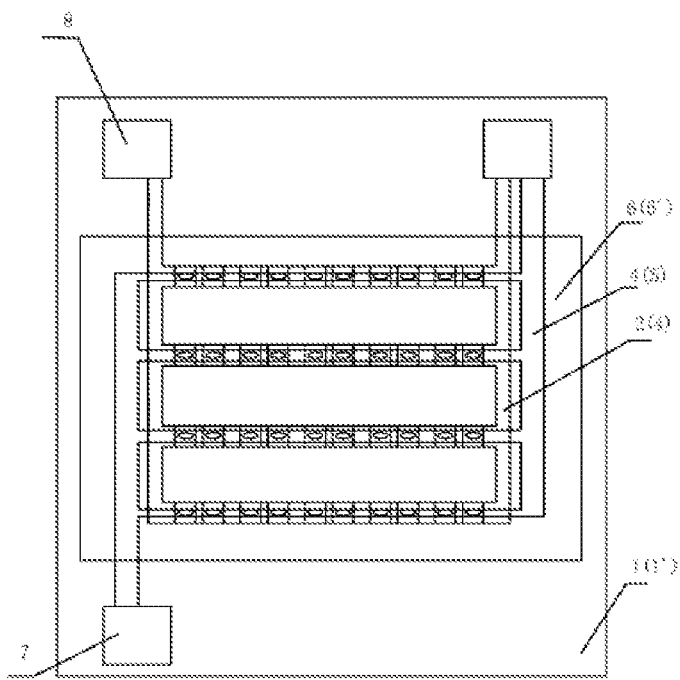
FIG. 7 is a top view of a typical magnetoresistive current limiter including N rows of magnetic tunnel junction lines connected in parallel and N+M (M=0) rows of conductive lines connected in parallel.
Figure 8:
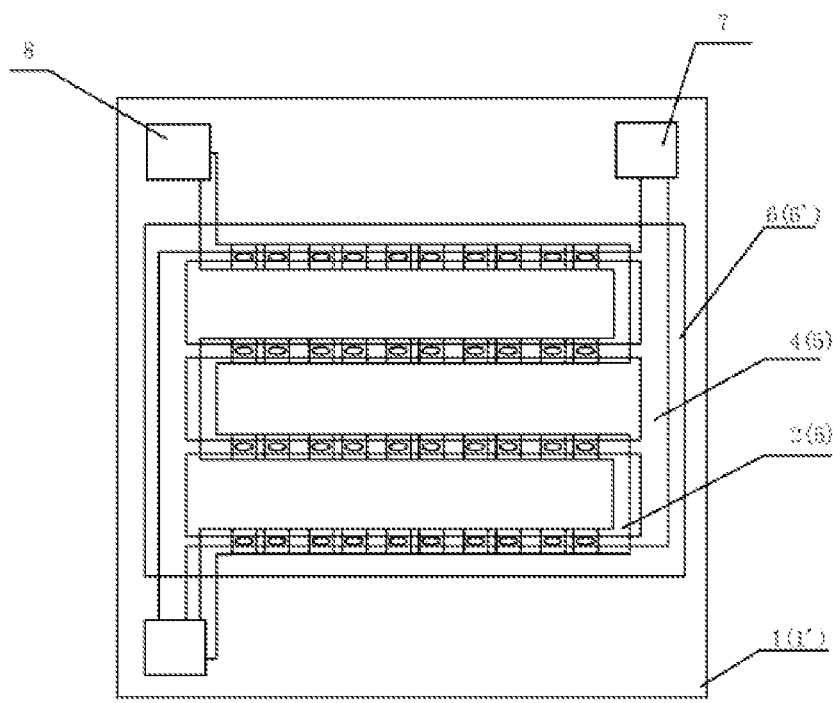
FIG. 8 is a top view of a typical magnetoresistive current limiter including N rows of magnetic tunnel junction lines connected in series and N+M (M=0) rows of conductive lines connected in parallel.
Figure 9:
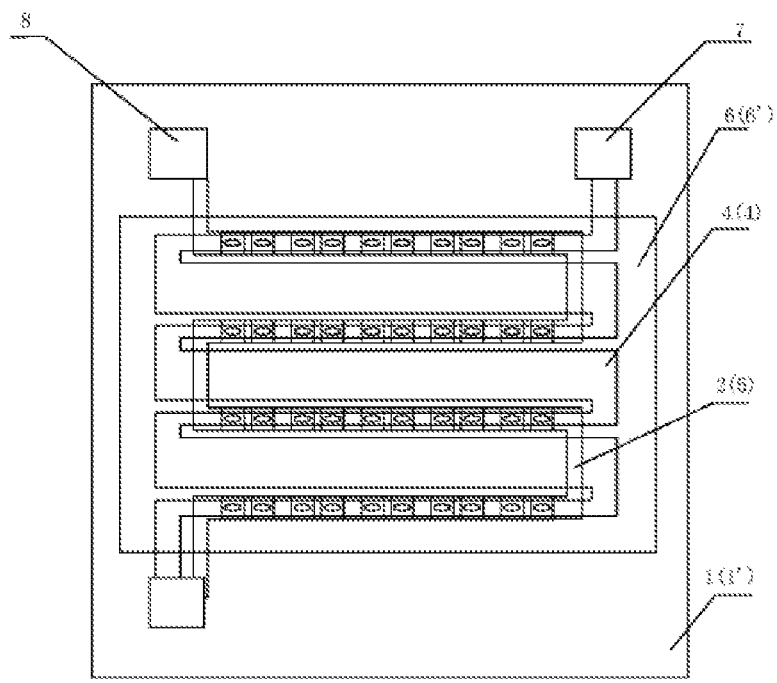
FIG. 9 is a top view of a typical magnetoresistive current limiter including N rows of magnetic tunnel junction lines connected in series and 2*N+M (M=−1) rows of conductive lines connected in series.
Figure 10:
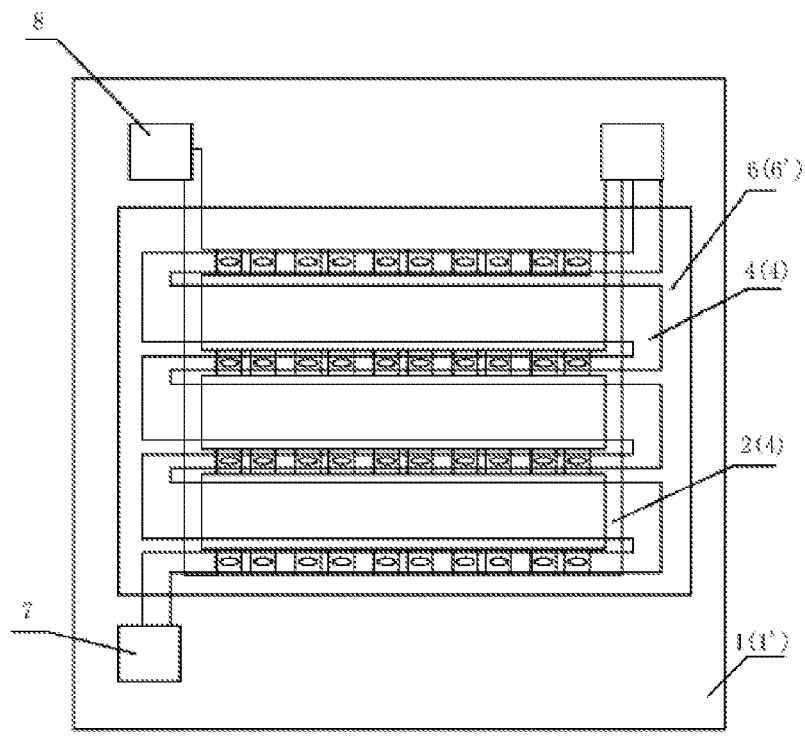
FIG. 10 is a top view of a typical magnetoresistive current limiter including N rows of magnetic tunnel junction lines connected in series and 2*N+M (M=−1) rows of conductive lines connected in series.

In the magnetoresistive current limiter shown in FIGS. 7-10, the magnetoresistive sensor layer includes N (N is an integer greater than 1) array-type magnetic tunnel junction lines, magnetic tunnel junction units in each magnetic tunnel junction line are connected in series, and the magnetic tunnel junction lines are connected in series to form a two-port structure of the magnetoresistive sensor layer 2 (5) as shown in FIG. 8 and FIG. 9 or connected in parallel to form a two-port structure of the magnetoresistive sensor layer 2 (4) as shown in FIG. 7 and FIG. 10. For the two structures of the magnetoresistive sensor layer, the corresponding coil 4 has two structures: one is that the coil includes 2*N+M (M=1) conductive lines, and the conductive lines form the series connection shown by the part of the coil 4 (4) as in FIG. 9 and FIG. 10. Part of the conductive lines are located above or below the magnetic tunnel junction lines, other parts of the conductive lines are located between the magnetic tunnel junction lines, current flows, in the positive direction, into the conductive lines above or below the magnetic tunnel junction lines and flows, in the negative direction, into the conductive lines between the magnetic tunnel junction lines, and the sectional dimensions of the first and last conductive lines located above or below the magnetic tunnel junction lines are increased relative to the sectional dimensions of middle conductive lines located above or below the magnetic tunnel junction lines, to generate the same components of magnetic fields of magnetically sensitive axes at the corresponding magnetic tunnel junction lines, that is, the current generates a constant magnetic field in the direction of the sensitive axis at the position of each tunnel junction line of the magnetoresistive sensor layer. The other one is that the coil includes N+M (M=0) conductive lines, and the conductive lines form the parallel connection shown by the part of the coil 4 (5) as in FIG. 7 and FIG. 8; the conductive lines are all located above or below the magnetic tunnel junction lines, the current flows in the same direction into all the conductive lines located above or below the magnetic tunnel junction lines, and the sectional dimensions of the first and last conductive lines located above or below the magnetic tunnel junction lines are decreased relative to the sectional dimensions of middle conductive lines located above or below the magnetic tunnel junction lines, to generate the same components in directions of the magnetically sensitive axes to the magnetic fields at the corresponding magnetic tunnel junction lines.

Figure 11:
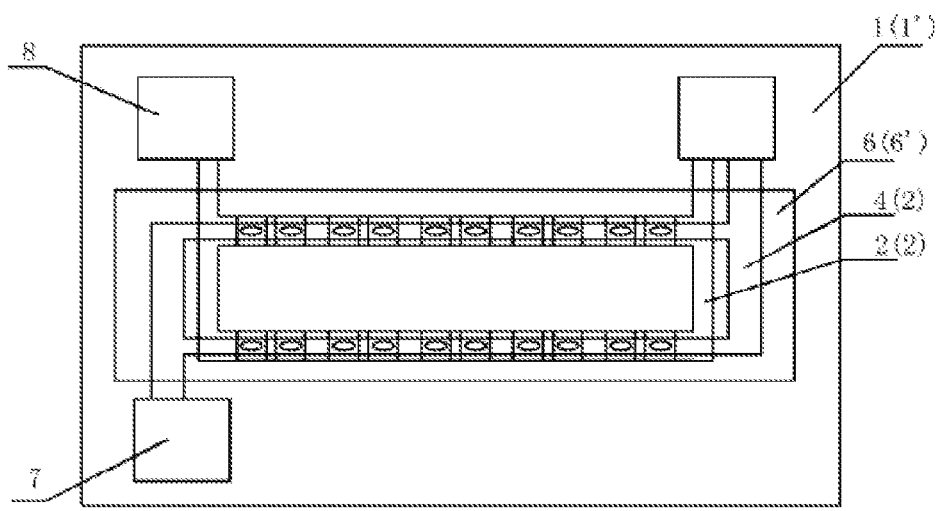
FIG. 11 is a top view of a typical magnetoresistive current limiter including N rows of magnetic tunnel junction lines connected in parallel and N+M (M=0) rows of conductive lines connected in parallel.
Figure 12:
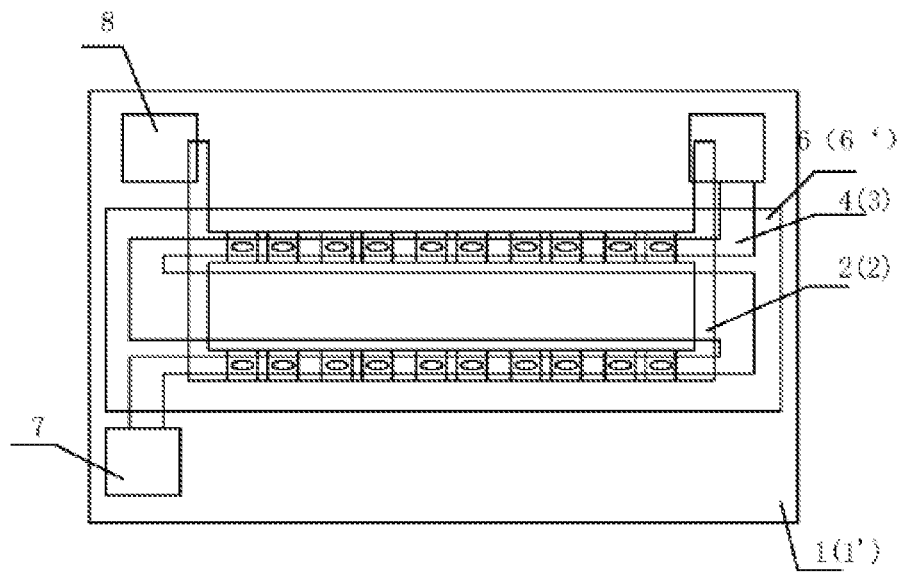
FIG. 12 is a top view of a typical magnetoresistive current limiter including N rows of magnetic tunnel junction lines connected in parallel and 2*N+M (M=−1) rows of conductive lines connected in series.
Figure 13:
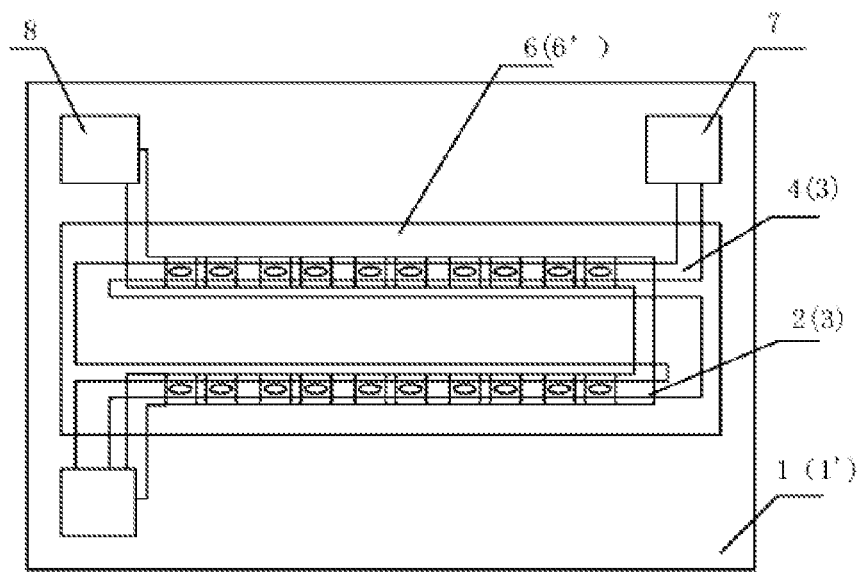
FIG. 13 is a top view of a typical magnetoresistive current limiter including N rows of magnetic tunnel junction lines connected in series and 2*N+M (M=−1) rows of conductive lines connected in series.
Figure 14:
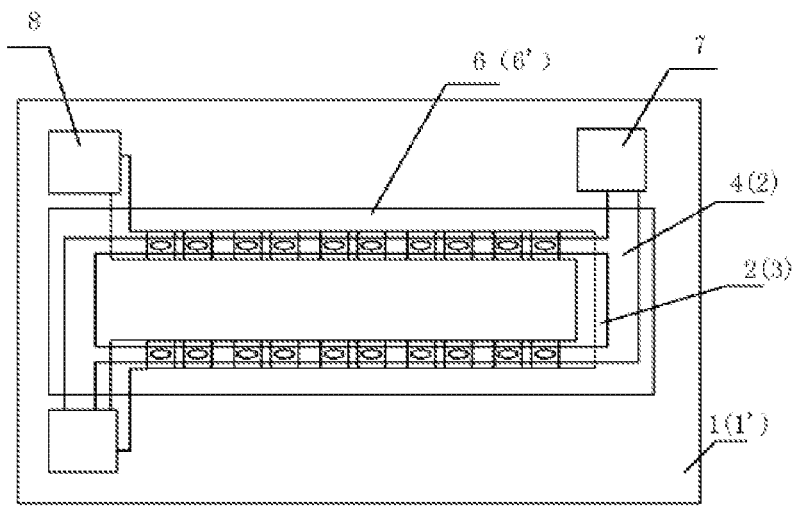
FIG. 14 is a top view of a typical magnetoresistive current limiter including N rows of magnetic tunnel junction lines connected in series and N+M (M=0) rows of conductive lines connected in parallel.

In the magnetoresistive current limiter shown in FIGS. 11-14, the magnetoresistive sensor layer includes N=2 magnetic tunnel junction lines arranged in parallel, the magnetic tunnel junction units in each magnetic tunnel junction line are connected in series, and the magnetic tunnel junction lines are connected in series to form a two-port structure of the magnetoresistive sensor layer 2 (3) as shown in FIG. 13 and FIG. 14 or connected in parallel to form a two-port structure of the magnetoresistive sensor layer 2 (2) as shown in FIG. 11 and FIG. 12. For the two structures of the magnetoresistive sensor layer, the corresponding coil 4 has two structures: one is that the coil 4 includes 2*N+M (M=−1) conductive lines, and the conductive lines are connected in series to form the coil 4 (3) as shown in FIG. 12 and FIG. 13; part of the conductive lines are located above or below the magnetic tunnel junction lines, other parts of the conductive lines are located between the magnetic tunnel junction lines, current flows, in the positive direction, into the conductive lines above or below the magnetic tunnel junction lines and flows, in the negative direction, into the conductive lines between the magnetic tunnel junction lines, and the sectional dimensions of the first and last conductive lines located above or below the magnetic tunnel junction lines are the same, to generate the same components of magnetic fields of the magnetically sensitive axes at the corresponding magnetic tunnel junction lines. The other one is that the coil 4 includes N+M (M=0) conductive lines, and the conductive lines form the coil 4 (2) as shown in FIG. 11 and FIG. 14; the conductive lines are all located above or below the magnetic tunnel junction lines, the current flows in the same direction into all the conductive lines located above or below the magnetic tunnel junction lines, the sectional dimensions of the first and last conductive lines located above or below the magnetic tunnel junction lines are the same, and components of magnetic fields of the magnetically sensitive axes generated at the corresponding magnetic tunnel junction lines are the same.

Figure 15:
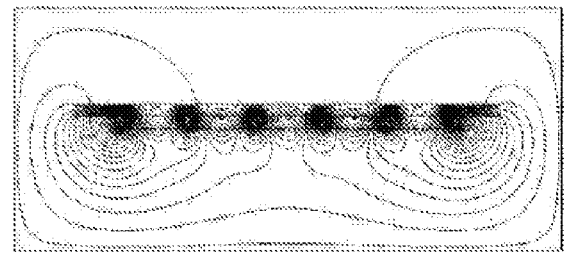
FIG. 15 is a view of distribution of magnetic lines of force of a magnetic shield layer and an energized series conductive line coil.
Figure 16:
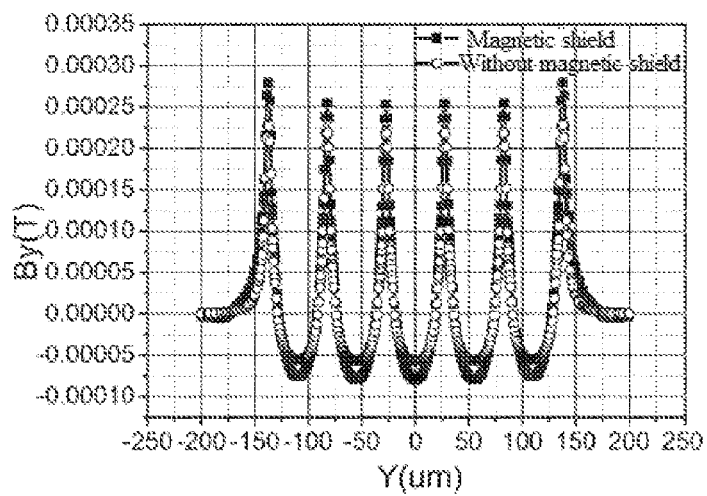
FIG. 16 is a view of distribution of components of a magnetic field in the direction of a sensitive axis generated on the magnetoresistive sensor layer by the magnetic shield layer and the energized series conductive line coil.

FIG. 15 is a view of distribution of vectors of a magnetic field generated by the series conductive line coil 4 (0) and the magnetic shield layer 6 (6') correspondingly shown in FIG. 3 and FIG. 4 in the event that direct current flows through the input-output electrode, from which it can be seen that the current generates a circular magnetic field at the conductive lines, and the intensity is enhanced after the magnetic field passes through the magnetic shield layer 6 (6'). FIG. 16 is a curve of distribution of magnetic field components By of the conductive lines at the positions of the magnetic tunnel junction units along the directions of the magnetically sensitive axes, from which it can be seen that magnetic field distribution features of magnetic field components By generated by conductive lines located above or below the tunnel junction lines having the same current direction which correspond to high magnetic field amplitude are the same, while the magnetic field components By generated by the conductive lines in the same direction on two ends are higher than those in the middle section. Therefore, only when the magnetic tunnel junction lines correspond to the conductive lines of the currents in the same direction in the middle section, can it be ensured that all the magnetic tunnel junction unit feel the same magnetic field components By.

In order to study influences of the magnetic shield layer 6 (6') on distribution features of the magnetic field components By, FIG. 16 further illustrates a curve of magnetic field distribution features of the magnetic field components By in the absence of the magnetic shield layer. It can be seen that the magnetic field amplitude thereof is evidently less than that in the presence of the magnetic shield layer. Therefore, one function of the magnetic shield plate layer is to increase the amplitude of the magnetic field components By.

Figure 17:
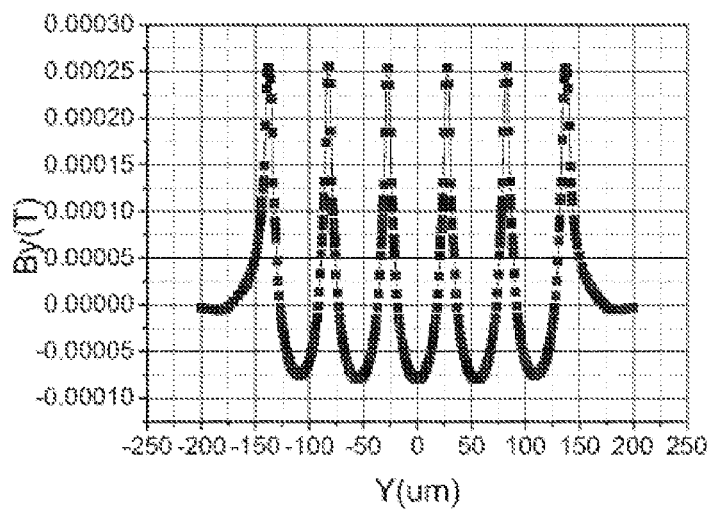
FIG. 17 is a view of distribution of components of a magnetic field in the direction of a sensitive axis generated on the magnetoresistive sensor layer by increasing sectional dimensions of two ends of a series conductive line, for example, after increase of the width.

FIG. 17 is a view of magnetic field distribution illustrating that, corresponding to the series conductive line coil 4 (4) in FIG. 9 and FIG. 10, the magnetic field amplitude of the magnetic field components By at positions of two ends is reduced by increasing sectional dimensions of the conductive lines on the two ends, so as to obtain the same amplitude as those in the middle section, from which it can be seen that all the conductive lines corresponding to the currents in the same direction have the same magnetic field amplitude, and thus the tunnel junction lines can be placed above or below all the conductive lines in the same direction including those on the two ends.

For the series conductive line coil 4 (3) in FIG. 12 and FIG. 13, since there are only two conductive lines located above or below the magnetic tunnel junction lines in the same direction, which are both on the two ends, it is apparent that amplitudes of the magnetic field components By along the directions of the sensitive axes generated at the corresponding magnetic tunnel junction lines are the same.

Figure 18:
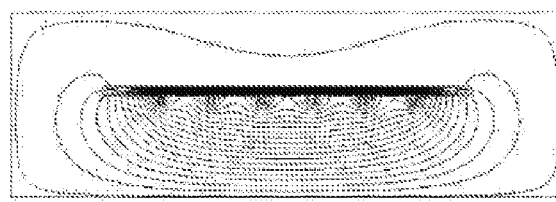
FIG. 18 is a view of distribution of magnetic lines of force of a magnetic shield layer and an energized parallel conductive line coil.
Figure 19:
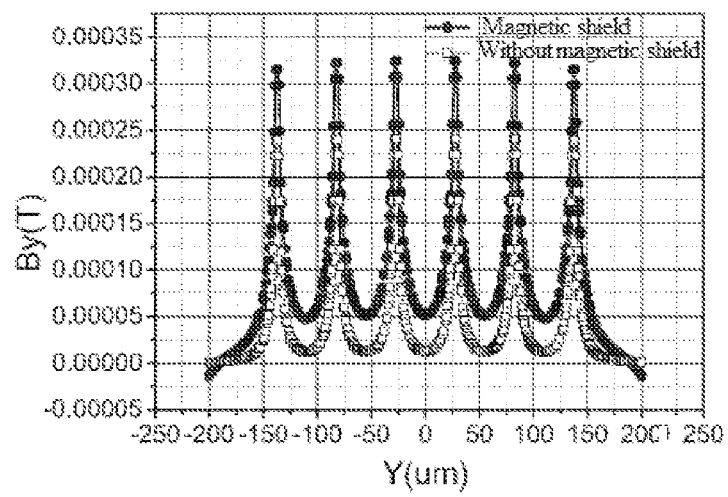
FIG. 19 is a view of distribution of components of a magnetic field in the direction of a sensitive axis generated on the magnetoresistive sensor layer by the magnetic shield layer and the energized parallel conductive line coil.

FIG. 18 is a view of distribution of vectors of a magnetic field generated by the parallel conductive line coil 4 (1) and the magnetic shield layer 6 (6') correspondingly shown in FIG. 5 and FIG. 6 in the event that direct current flows through the input-output electrode. It can be seen that the magnetic field surrounds the conductive lines, and is also enhanced in the magnetic shield layer 6 (6'). FIG. 19 is a view of distribution of magnetic field components By in the directions of the sensitive axes produced by the conductive lines of the currents in the same direction at the positions of the magnetic tunnel junctions, from which it can be seen that in the case of the magnetic shield layer 6 (6'), the amplitude of the magnetic field components By is higher. Similarly, distribution of magnetic field intensity of the magnetic field components By at the conductive lines in the middle section is the same, while the magnetic field amplitude of the conductive lines on the two ends is lower than those in the middle section. Therefore, only when the magnetic tunnel junction lines are placed in the middle section, can it be ensured that all the magnetic tunnel junction unit feel the same magnetic field components By.

Figure 20:
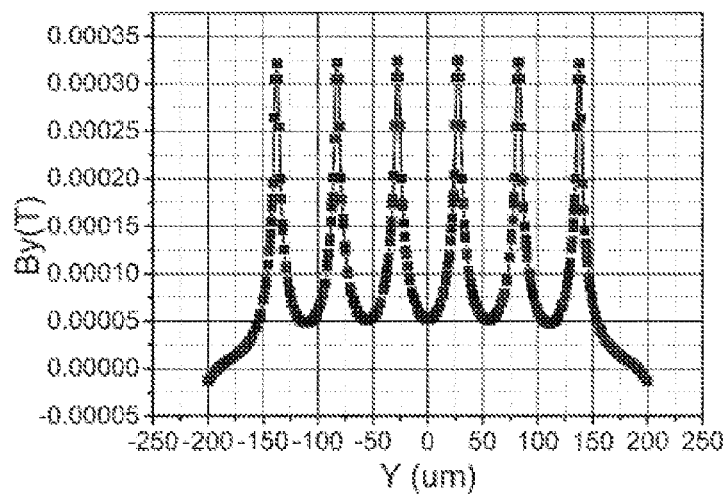
FIG. 20 is a view of distribution of components of a magnetic field in the direction of a sensitive axis generated on the magnetoresistive sensor layer by decreasing sectional dimensions of two ends of a parallel coil, for example, after increase of the width.

FIG. 20 is a view of magnetic field distribution illustrating that, corresponding to the series conductive line coil 4 (5) in FIG. 7 and FIG. 8, the current density thereof is increased by decreasing sectional dimensions of the conductive lines on the two ends so as to improve the magnetic field amplitude corresponding to the conductive lines on the two ends, to cause the conductive lines in the middle section and on the two ends to generate the magnetic field components By with the same magnetic field amplitude; therefore, the magnetic tunnel junction lines can correspond to all the parallel conductive lines.

The parallel conductive line coil 4 (2) corresponding to FIG. 11 and FIG. 14 only includes two conductive lines in the same direction corresponding to the magnetic tunnel junction lines, which are both on the two ends, and thus the magnetic field components By generated are at the same amplitude and it is unnecessary to adjust the sectional dimensions.

Figure 21:
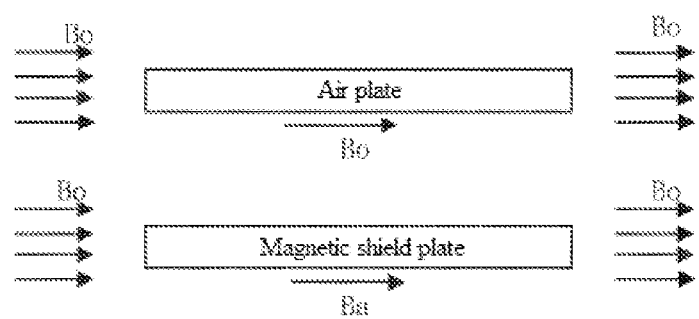
FIG. 21 is a schematic view of a calculation model of a magnetic field attenuation factor of an air layer and a magnetic shield layer in a uniform magnetic field.
Figure 22:
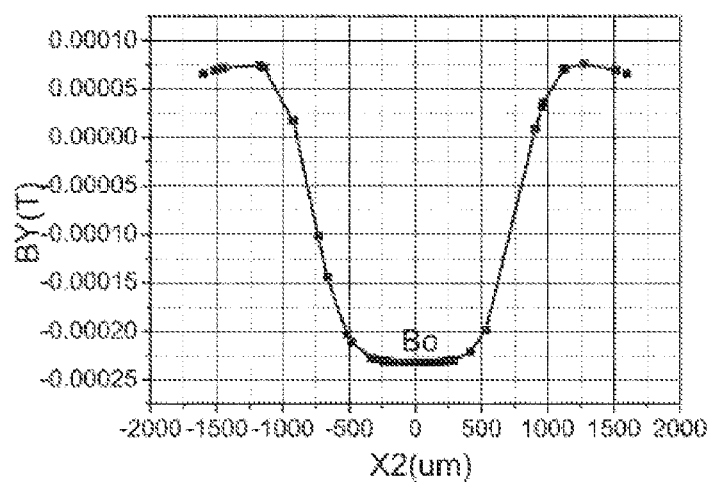
FIG. 22 is a distribution curve of the By component of the magnetic field of the air layer.
Figure 23:
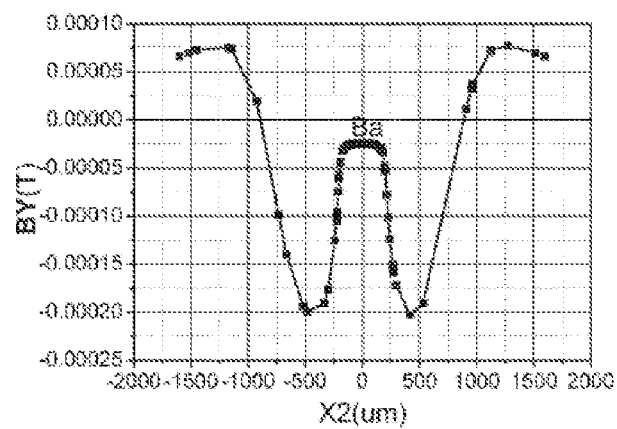
FIG. 23 is a distribution curve of the By component of the magnetic field of the magnetic shield layer.

The magnetic shield layer 6 (6') used in FIG. 15 and FIG. 18 can cause magnetic field components By generated at the positions of the magnetic tunnel junction units by the conductive lines of the coil 4 (4') to be increased significantly, on the other hand, the magnetic tunnel junction units can be protected from being affected by the external magnetic field. Reference can be made to FIG. 21 for an attenuation model of the external magnetic field, in a uniform magnetic field Bs generated in a Helmholtz coil, in the absence of the magnetic shield layer 6 (6'), distribution of components of the magnetic field in the directions of the sensitive axis thereof is as shown in FIG. 22, while, when the magnetic shield layer 6 (6') is present, distribution of the corresponding Ba magnetic field is as shown in FIG. 12, the magnetic field attenuation factor is about 9:1, that is, after the external magnetic field passes through the magnetic shield layer 6 (6'), the amplitude thereof is attenuated to one ninth of the original one, thereby effectively protecting the magnetic tunnel junction units.

Figure 24:
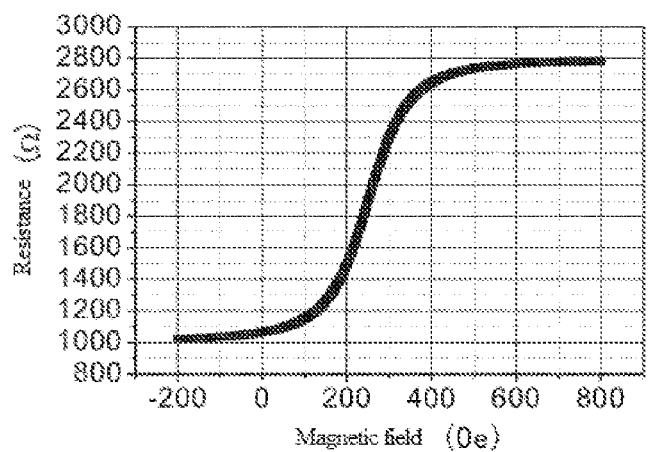
FIG. 24 is a curve graph of features of a unidirectional linear rise in resistance to the magnetic field of the magnetic tunnel junction.

A characteristic curve of the relationship between the resistance of the magnetoresistive sensor layer and the external magnetic field plays a decisive role in the magnetoresistive current limiter. The characteristic curve also depends on the angle relationship between free layers and pinned layers in the magnetic tunnel junction units and also depends on deviation of the characteristic curve. Referring to the characteristic curve as shown in FIG. 24, within a forward magnetic field range, with increase of the magnetic field, the resistance of the magnetoresistive sensor layer linearly increases, such a situation applies to direct current circuits, the magnetic field components By generated by the conductive lines of the coil 4 (4') act upon the magnetic tunnel junction lines, when the working current is a normal value, the resistance of the magnetoresistive sensor layer is in the position of the maximum value or the minimum value, when the current in the circuit suddenly decreases, the By magnetic field generated by the coil 4 (4') also decreases, and the resistance of the magnetoresistive sensor layer 2 (2') decreases, so as to cause the amplitude of the decrease of the current in the direct current circuit to be limited; when the current in the circuit suddenly increases, the By magnetic field generated by the coil 4 (4') increases, and the resistance of the magnetoresistive sensor layer 2 (2') increases, so as to cause the amplitude of the increase of the current in the direct current circuit to be limited.

Figure 25:
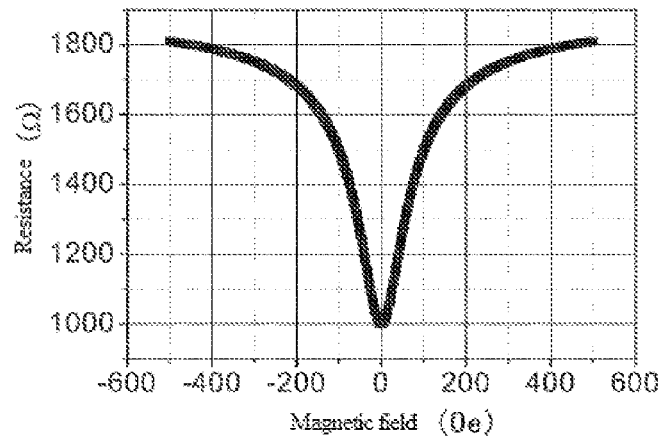
FIG. 25 is a curve graph of features of an axisymmetric linear rise in resistance to the magnetic field of the magnetic tunnel junction.

As shown in FIG. 25, a characteristic relation curve of the resistance of the magnetoresistive sensor layer and the external magnetic field has axisymmetric distribution features, and with increase of the amplitude of the magnetic field, the resistance increases. Such a situation applies to the current limiting effect of alternating current circuits, in the normal working current, the resistance of the magnetoresistive sensor layer is in the position of the minimum value or the maximum value, no matter whether the amplitude of the positive current increases or the amplitude of the negative current increases, it may result in increase of the resistance of the magnetoresistive sensor layer, so as to cause the amplitude of increase of the alternating current to be limited; when the resistance is in the position of the maximum value and when the current is less than the normal value, with decrease of the magnetic field, the resistance decreases, so as to cause the amplitude of decrease of the current to be limited.

Figure 26:
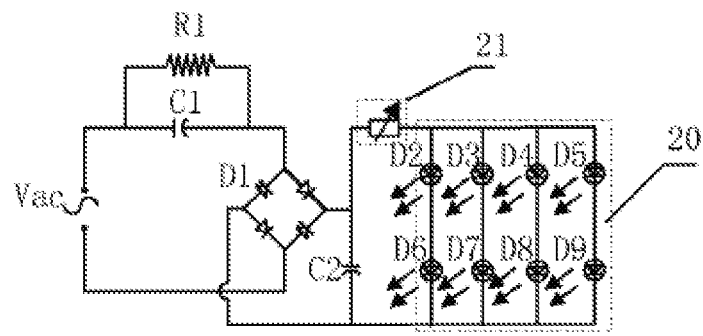
FIG. 26 is a schematic view of application of the magnetoresistive current limiter in a direct current LED lamp circuit.

As shown in FIG. 26, after an alternating current power supply is rectified and filtered, a direct current is obtained, and an LED lamp 20 is powered through a magnetoresistive current limiter 21. The magnetoresistive current limiter 21 includes a substrate 1 (1'), a magnetoresistive sensor layer 2 (2'), a coil 4 (4'), a magnetic shield layer 6 (6'), a first insulating layer 3 (3'), a second insulating layer 5 (5'), an input electrode 7 and an output electrode 8, wherein the coil 4 (4') is located between the magnetoresistive sensor layer 2 (2') and the magnetic shield layer 6 (6'), the first insulating layer 3 (3') and the second insulating layer 5 (5') are respectively located between the magnetoresistive sensor layer 2 (2') and the current as well as between the current layer and the magnetic shield layer 6 (6'), the coil 4 (4') and the magnetoresistive sensor layer 2 (2') are connected in series, and the other ports of the magnetoresistive sensor layer 2 (2') and the coil 4 (4') are connected with the input electrode 7 and the output electrode 8 respectively. The topology structure thereof has two forms: one is that the magnetoresistive sensor layer 2 is directly located on the substrate 1, the coil 4 is located above the magnetoresistive sensor layer 2, and the magnetic shield layer 6 is located on the top; the other one is that the magnetic shield layer 6' is directly located on the substrate 1', the magnetoresistive sensor layer 2' is located on the top, and the coil 4' is located below the magnetoresistive sensor layer 2'. The magnetoresistive sensor layer 2 (2') includes N (N is an integer greater than 1) array-type magnetic tunnel junction lines, magnetic tunnel junction units in each line are connected in series, the magnetic tunnel junction lines are connected in series or connected in parallel into a two-port structure, and magnetically sensitive axes of the magnetic tunnel junction units are perpendicular to the magnetic tunnel junction lines. The corresponding coil has two connection modes, one is that the conductive lines are connected in series, 2*N+M (M=−1 or 3) conductive lines are included, and the current flows, in the positive direction, into the conductive lines located above or below the tunnel junction lines and flows, in the negative direction, into the conductive lines between the magnetic tunnel junction lines; the other is that the conductive lines are connected in parallel, N+M (M=0 or 2) conductive lines are included, and the current flows in the same direction into the conductive lines located above or below the tunnel junction lines. When M>0, the conductive lines of the coil may have the same sectional dimension, and in addition, the sectional dimension of each conductive line may change to generate the same magnetic field component along the direction of the sensitive axis at the magnetic tunnel junction unit thereabove or therebelow.

The first insulating layer 3 (3') and the second insulating layer 5 (5') are made of silicon dioxide, aluminum oxide, silicon nitride, photoresist or benzocyclobutene or other materials, and the thickness thereof is 100 μm to 1000 μm; the coil 4 (4') is made of a high conductivity metal material such as copper, gold or silver, and the thickness thereof is within a range of 1 μm to 10 μm; the conductive lines have a width of 5 μm to 40 μm, and the spacing between adjacent conductive lines is 10 μm to 100 μm. The magnetic shield layer 6 (6') is made of a high permeability ferromagnetic alloy material such as NiFe, CoZrNb, CoFeSiB, CoFeB, FeSiB or FeSiBNbCr, and the thickness thereof is within a range of 1 μm to 10 μm.

The direct current flows into the magnetoresistive sensor layer 2 (2') through the input electrode 7, then flows into the coil 4 (4'), and finally flows out through the output electrode 8. When an alternating current supply voltage fluctuates to lead to increase of the working current of the circuit, the current in the conductive lines of the coil 4 (4') increases, resulting in that the magnetic field components By in the directions of the sensitive axes generated at the magnetic tunnel junction lines increase, since, at this point, the magnetoresistive sensor layer has the feature of a unidirectional linear rise in resistance to the magnetic field and the resistance is in the position of the minimum value in the case of normal working current, increase of the magnetic field results in increase of the resistance of the magnetoresistive sensor layer, so that the amplitude of the increase of the current is limited, the LED lamp 20 is protected, and when the supply voltage returns to normal, the amplitude of the current returns to normal, and the resistance of the magnetoresistive sensor layer and the magnetic field both return to the initial value; another situation is as follows: when the alternating current supply voltage fluctuates to lead to decrease of the working current of the circuit, the current in the conductive lines decreases to lead to decrease of the magnetic field components By in the directions of the sensitive axes generated at the magnetic tunnel junction lines, at this point, the magnetoresistive sensor layer is still selected to have the feature of a unidirectional linear rise in resistance to the magnetic field, and the resistance is in the position of the maximum value in the case of the normal working current; therefore, decrease of the magnetic field results in decrease of the resistance of the magnetoresistive sensor layer, to limit the amplitude of the decrease of the current.

Figure 27:
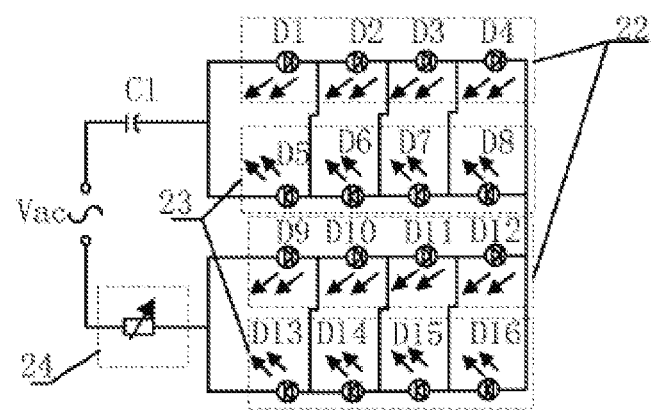
FIG. 27 is a schematic view of application of the magnetoresistive current limiter in an alternating current LED lamp circuit.

As shown in FIG. 27, the structure of the magnetoresistive current limiter is as described above, the alternating current power supply directly powers LED lamps 22-23, the LED lamps are connected through forward and reverse parallel connections, when the alternating current power supply works within a positive half cycle range, the forward LED lamp 22 works, and when the alternating current power supply works within a negative half cycle range, the reverse LED lamp 23 works. The magnetoresistive current limiter 24 is connected in series with the LED lamps 22-23, the working alternating current flows into the magnetoresistive sensor layer 2 (2') through the input electrode 7, then flows into the coil 4 (4'), and flows out through the current output electrode 8. At this point, the magnetoresistive sensor layer having a symmetric resistance-magnetic field feature is selected, the resistance increases with increase of the amplitude of the magnetic field, when the working current is a normal value, the resistance is in the position of the minimum value, when the alternating current power supply fluctuates in the positive direction, the amplitude of the magnetic field component By in the positive direction increases, thus leading to increase of the resistance of the magnetoresistive current limiter, so that the amplitude of the positive current is limited and the LED lamp 22 is protected, when the alternating current power supply fluctuates in the negative direction, the amplitude of the magnetic field component By in the negative direction increases, the resistance of the magnetoresistive current limiter also increases, so that the amplitude of the negative current is limited and the LED lamp 23 is protected, when the alternating current power supply returns to normal, the current returns to normal, and at this point, the magnetic field component By and the resistance of the magnetoresistive sensor layer return to normal, to cause the LED lamps to return to the normal state. Another situation is as follows: the alternating current power supply fluctuates to lead to decrease of the working current, at this point, the magnetoresistive sensor layer having a symmetric resistance-magnetic field feature is still selected, positive and negative half cycles of the alternating current power supply respectively correspond to magnetic field-resistance positive and negative half cycles, and when the working current is normal, the resistance is in the corresponding position of the maximum value; when the working current decreases, the magnetic field component By decreases, so that the resistance of the magnetoresistive sensor layer decreases and the amplitude of decrease of the current is limited.

The above descriptions are merely preferred embodiments of the present invention, but are not intended to limit the present invention. For persons skilled in the art, the present invention may have various modifications and changes. Any modification, equivalent replacement, improvement and the like made within the spirit and principle of the present invention shall be included in the claimed scope of the present invention.

The invention claimed is:

1. A magnetoresistive current limiter, comprising:
a substrate,
an input electrode,
an output electrode,
a magnetoresistive sensor layer,
a first insulating layer,
a coil, a second insulating layer and
a magnetic shield layer;
wherein the coil is located between the magnetic shield layer and the magnetoresistive sensor layer, the first insulating layer isolates the coil from the magnetoresistive sensor layer, and the second insulating layer isolates the coil from the magnetic shield layer; and
wherein the magnetoresistive sensor layer comprises N rows of array-type magnetic tunnel junction lines, N is an integer greater than 1, each row of magnetic tunnel junction lines comprise one or more interconnected magnetic tunnel junction units, the magnetic tunnel junction lines form a two-port structure of the magnetoresistive sensor layer in a mode of series connection, parallel connection or a combination of series connection and parallel connection, the coil also has a two-port structure, one port of the magnetoresistive sensor layer is connected with one port of the coil, the other port of the magnetoresistive sensor layer is connected with the input electrode, and the other port of the coil is connected with the output electrode; and current flows into the magnetoresistive sensor layer via the input electrode and then flows out of the output electrode via the coil.

2. The magnetoresistive current limiter according to claim 1, wherein the resistance of the magnetoresistive sensor layer is in a linear relationship with a magnetic field produced by the current flowing through the input electrode-output electrode, or the resistance of the magnetoresistive sensor layer forms symmetric linear distribution characteristics with an absolute value of the magnetic field produced by the current flowing through the input electrode-output electrode, when the current flowing through the input electrode-output electrode is a normal value, the resistance of the magnetoresistive sensor layer is in the position of a minimum value or maximum value, and with increase or decrease of direct current, the corresponding resistance thereof also increases or decreases correspondingly.

3. The magnetoresistive current limiter according to claim 1, wherein the magnetic tunnel junction units are connected in a mode of series connection, parallel connection or a combination of series connection and parallel connection, and magnetically sensitive axes of the magnetic tunnel junction units are perpendicular to the magnetic tunnel junction lines.

4. The magnetoresistive current limiter according to claim 1, wherein the coil comprises (2*N+M) conductive lines, wherein N>1, M=−1 or 3, the conductive lines are connected in series, the conductive lines are parallel to the magnetic tunnel junction lines, part of the conductive lines are located above or below the magnetic tunnel junction lines, the other part of the conductive lines are located between the magnetic tunnel junction lines, the current flows, in the positive direction, into the conductive lines located above or below the magnetic tunnel junction lines, and flows, in the negative direction, into the conductive lines located between the two magnetic tunnel junction lines.

5. The magnetoresistive current limiter according to claim 4, wherein, when M>0, sectional dimensions of the conductive lines of the coil are the same; when M=0 or M<0, the sectional dimensions of the conductive lines of the coil are changed so as to ensure that a constant magnetic field in the direction of a sensitive axis is produced at the position of each magnetic tunnel junction line of the magnetoresistive sensor layer.

6. The magnetoresistive current limiter according to claim 1, wherein the coil comprises (N+M) conductive lines, wherein N>1, M=0 or 2, the conductive lines are connected in parallel, the conductive lines are parallel to the magnetic tunnel junction lines, the conductive lines are located above or below the magnetic tunnel junction lines, and current flows in the same direction into the conductive lines respectively.

7. The magnetoresistive current limiter according to claim 1, wherein the first insulating layer and the second insulating layer are made of silicon dioxide, aluminum oxide, silicon nitride, photoresist or benzocyclobutene.

8. The magnetoresistive current limiter according to claim 1, wherein the coil is made of such a high conductivity metal material as copper, gold or silver.

9. The magnetoresistive current limiter according to claim 1, wherein the magnetic shield layer is made of such a high permeability ferromagnetic alloy as NiFe, CoFeSiB, CoZrNb, CoFeB, FeSiB or FeSiBNbCu.

10. The magnetoresistive current limiter according to claim 1, wherein the coil has a thickness of 1 μm to 10 μm, the conductive lines have a width of 5 μm to 40 μm, and the spacing between two adjacent conductive lines is 10 μm to 100 μm.

11. The magnetoresistive current limiter according to claim 1, wherein both the first insulating layer and the second insulating layer have a thickness of 100 μm to 1000 μm.

12. The magnetoresistive current limiter according to claim 1, wherein the magnetic shield layer has a thickness of 1 μm to 10 μm.

* * * * *